United States Patent
Kwak et al.

(10) Patent No.: US 7,088,159 B2
(45) Date of Patent: Aug. 8, 2006

(54) REGISTER CONTROLLED DELAY LOCKED LOOP AND ITS CONTROL METHOD

(75) Inventors: Jong-Tae Kwak, Kyoungki-do (KR); Hyun-Woo Lee, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 30 days.

(21) Appl. No.: 11/020,597

(22) Filed: Dec. 21, 2004

(65) Prior Publication Data

US 2006/0001465 A1 Jan. 5, 2006

(30) Foreign Application Priority Data

Jun. 30, 2004 (KR) ............... 10-2004-0049847

(51) Int. Cl.
*H03L 7/00* (2006.01)
(52) U.S. Cl. ................. 327/161; 327/158
(58) Field of Classification Search ............. None
See application file for complete search history.

(56) References Cited

U.S. PATENT DOCUMENTS

| 6,750,688 | B1 | 6/2004 | Takai | |
|---|---|---|---|---|
| 6,765,976 | B1 | 7/2004 | Oh | |
| 6,768,361 | B1 | 7/2004 | Kwak | |
| 6,774,690 | B1 | 8/2004 | Baker et al. | |
| 6,836,166 | B1* | 12/2004 | Lin et al. | 327/158 |
| 6,917,229 | B1* | 7/2005 | Cho | 327/158 |
| 6,919,745 | B1* | 7/2005 | Lee et al. | 327/149 |
| 6,956,418 | B1* | 10/2005 | Kwak et al. | 327/158 |
| 2003/0122599 | A1* | 7/2003 | Kim | 327/161 |
| 2004/0239387 | A1 | 12/2004 | Zhang et al. | |
| 2006/0001463 | A1* | 1/2006 | Lee et al. | 327/147 |

FOREIGN PATENT DOCUMENTS

WO     WO00/25510     4/2000

\* cited by examiner

*Primary Examiner*—Timothy P. Callahan
*Assistant Examiner*—Cassandra Cox
(74) *Attorney, Agent, or Firm*—Blakely Sokoloff Taylor & Zafman

(57) ABSTRACT

A register controlled delay locked loop (DLL), including: a coarse delay line for generating a delayed input clock signal by delaying an external clock signal; a fine delay line unit for receiving the delayed input clock signal in order to generate a first fine delayed clock signal and a second fine delayed clock signal; a phase detector for comparing phases of the external clock signal and a feed-backed clock signal in order to generate a phase detection signal based on the comparison result; a phase mixer for generating a mixed clock signal by mixing phases of the first fine delayed clock signal and the second fine delayed clock signal based on a weight value; and a mixer controller for generating the weight value based on the phase detection signal.

15 Claims, 7 Drawing Sheets

REGISTER CONTROLLED DELAY LOCKED LOOP AND ITS CONTROL METHOD

FIELD OF INVENTION

The present invention relates to a delay locked loop (DLL) device; and, more particularly, to a register controlled DLL device for compensating a clock skew between an external clock signal and an internal clock signal.

DESCRIPTION OF PRIOR ART

Generally, in a synchronous semiconductor memory device, data access operations such as a read operation and a write operation are performed in synchronization with rising and falling edges of an external clock signal.

Since a time delay is generated while the external clock signal is inputted to the synchronous semiconductor memory device in order to be used as an internal clock signal of the synchronous semiconductor memory device, a delay locked loop (DLL) is employed for synchronizing the internal clock signal with the external clock signal by compensating a clock skew between the internal clock signal and the external clock signal.

Figure 1:
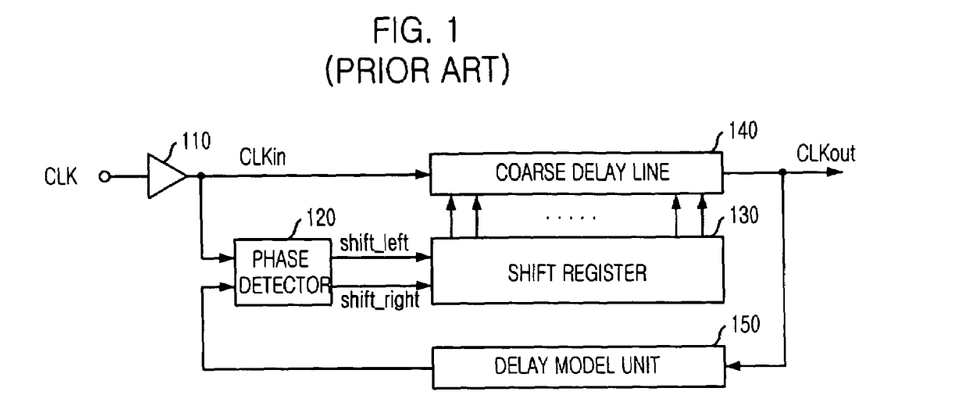
FIG. 1 is a block diagram showing a first conventional register controlled DLL.

FIG. 1 is a block diagram showing a first conventional register controlled DLL.

As shown, the first conventional register controlled DLL includes a first buffer 110, a first phase detector 120, a first coarse delay line 140, a first shift register 130 and a first delay model unit 150.

The first buffer 110 receives an external clock signal CLK for generating an input clock signal in_clk by buffering the external clock signal CLK. The input clock signal in_clk is delayed by the first coarse delay line 140 based on a plurality of delay control signals outputted from the first shift register 130, and, then, the delayed input clock signal is outputted as a delay locked clock signal dl_clk.

The first delay model unit 150 receives the delay locked clock signal dl_clk in order to output a feed-backed clock signal fb_clk by delaying the delay locked clock signal dl_clk for a predetermined delay time.

The first phase detector 120 compares phases of the input clock signal in_clk and the feed-backed clock signal fb_clk in order to generate a shift-left control signal sl_ctr and a shift-right control signal sr_ctr based on the comparison result.

The first shift register 130 generates the plurality of delay control signals based on the shift-left control signal sl_ctr and the shift-right control signal sr_ctr in order to control a delay amount of the first coarse delay line 140.

Figure 2:
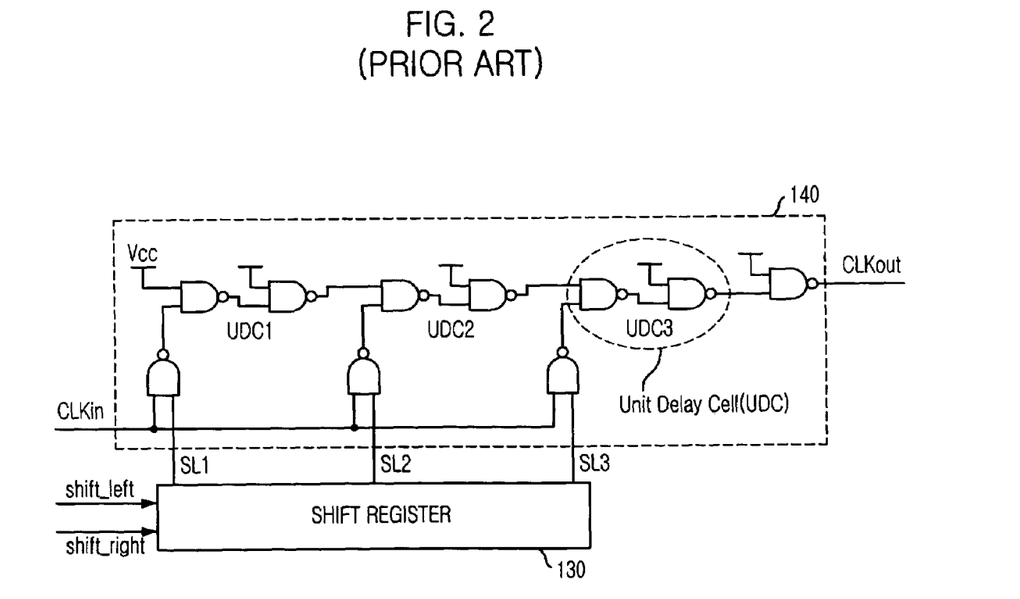
FIG. 2 is a schematic circuit diagram showing a first coarse delay line shown in FIG. 1.

FIG. 2 is a schematic circuit diagram showing the first coarse delay line 140.

As shown, the first coarse delay line 140 includes a plurality of unit delay cells (UDCs) each of which includes two NAND gates. Each of the plurality of unit delay cells has a unit delay amount. Herein, it is assumed that the first coarse delay line 140 includes three unit delay cells, i.e., a first to a third unit delay cells UDC1 to UDC3. It is also assumed that the plurality of delay control signals include a first to a third shift left signals SL1 to SL3 for controlling the first to the third unit delay cells UDC1 to UDC3. For example, if the third shift left signal SL3 is activated as a logic high level, the input clock signal in_clk is passed through the third unit delay cell UDC3 to be outputted as the delay locked clock signal dl_clk.

Thereafter, if the first shift register 130 shifts-left the plurality of delay control signals for increasing a delay amount of the first coarse delay line 140, i.e., if the first shift register 130 activates the second shift left signal SL2 instead of the third shift left signal SL3, the input clock signal in_clk is passed through the second and the third unit delay cells UDC2 and UDC3 to be outputted as the delay locked clock signal dl_clk.

However, since a delay amount of the first coarse delay line 140 is controlled by the plurality of unit delay cells as mentioned above, the input clock signal in_clk cannot be delayed by less than the unit delay amount.

Figure 3:
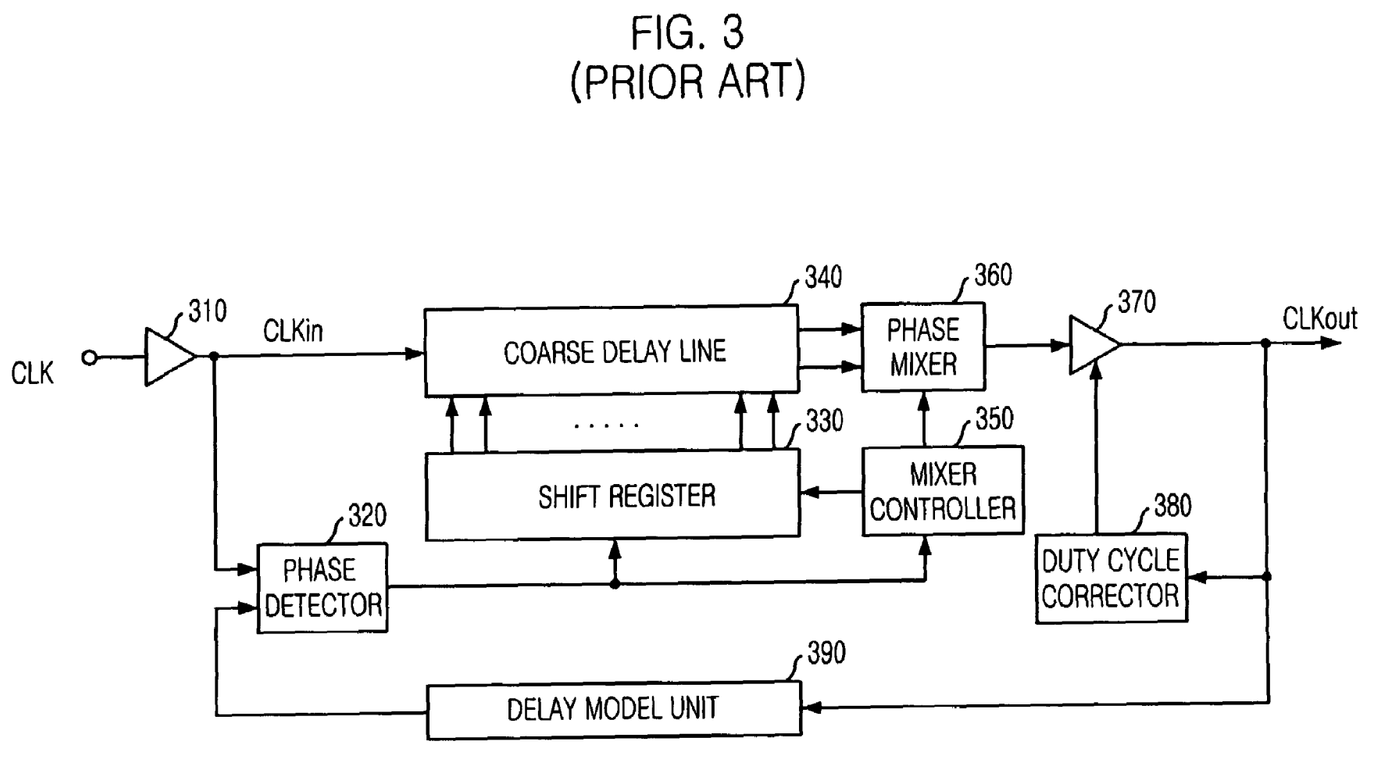
FIG. 3 is a block diagram showing a second conventional register controlled DLL.

FIG. 3 is a block diagram showing a second conventional register controlled DLL. The second conventional register controlled DLL is an upgraded version of the first conventional register controlled DLL.

As shown, the second conventional register controlled DLL includes a second buffer 310, a second coarse delay line 340, a second phase detector 320, a second shift register 330, a first phase mixer 360, a first mixer controller 350, a third buffer 370, a first duty cycle corrector 380 and a second delay model unit 390.

In comparison with the first conventional register controlled DLL shown in FIG. 1, the second conventional register controlled DLL further includes the first phase mixer 360, the first mixer controller 350 and the duty cycle corrector 380.

The coarse delay line 340 includes a plurality of unit delay cells each of which has a unit delay amount. The coarse delay line 340 delays an input clock signal in_clk outputted from the second buffer 310 for generating a first and a second delayed clock signals. Herein, one of the first delayed clock signal and the second delayed clock is passed through one more unit delay cell than the other. Therefore, there is a phase difference as much as the unit delay amount between the first and the second delayed clock signals.

The first phase mixer 360 receives the first and the second delayed clock signals from the second coarse delay line 340. Then, the first phase mixer 360 mixes phases of the first and the second delayed clock signals for generating a first mixed clock signal having a phase between phases of the first and the second delayed clock signals. That is, a phase of the first mixed clock signal leads one of phases of the first and the second delayed clock signals and lags behind the other. The first mixed clock signal is outputted as a delay locked clock signal dl_clk after being duty corrected by the first duty cycle corrector 380.

Therefore, comparing to the first conventional register controlled DLL, the second conventional register controlled DLL can more finely synchronize the delay locked clock signal dl_clk with the external clock signal CLK by using the first phase mixer 360.

Figure 4:
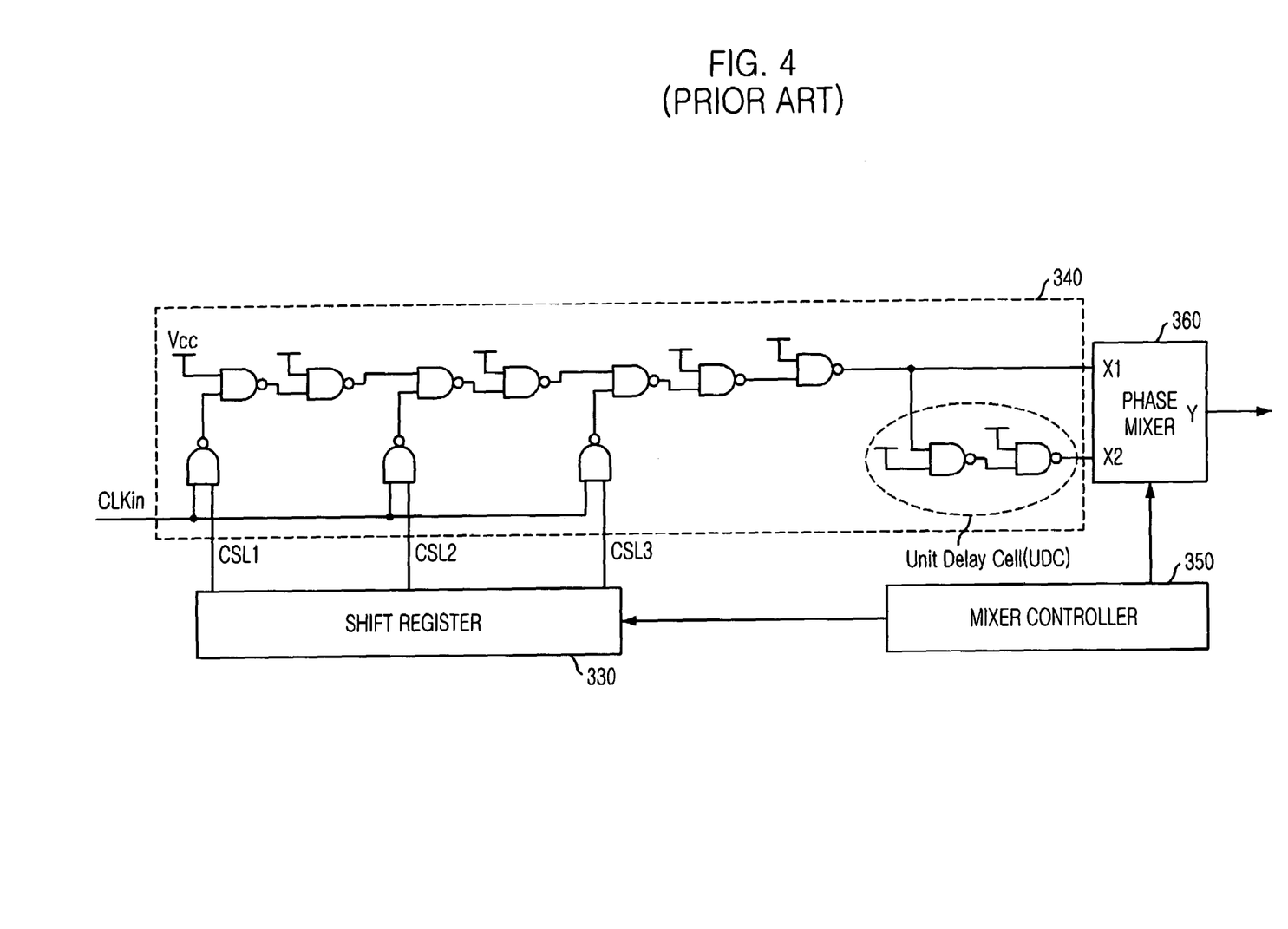
FIG. 4 is a schematic circuit diagram showing a second coarse delay line shown in FIG. 3.

FIG. 4 is a schematic circuit diagram showing the second coarse delay line 340.

As shown, the first and the second delayed clock signals are inputted to the first phase mixer 360 respectively through a first input terminal IN1 and a second input terminal IN2. Herein, it is assumed that the first delayed clock signal is inputted through the first input terminal IN1 and the second delayed clock signal is inputted thorough the second input terminal IN2. As mentioned above, the second delayed clock signal is passed through one more unit delay cell comparing to the first delayed clock signal.

Figure 5:
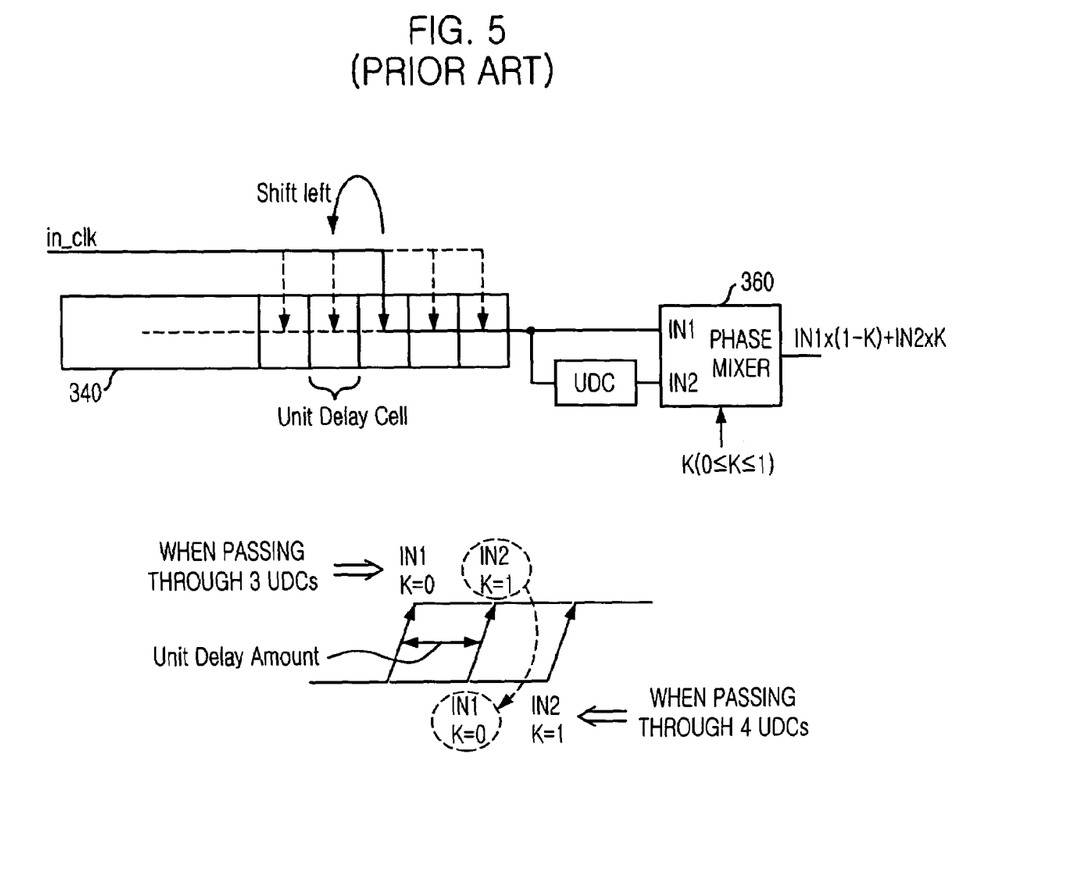
FIG. 5 is a diagram illustrating an operation of a second coarse delay line shown in FIG. 4.

FIG. 5 is a diagram illustrating an operation of the second coarse delay line 340 for showing a problem of the second conventional register controlled DLL.

Each rectangular shape of the second coarse delay line 340 represents a unit delay cell. Generally, the unit delay cell includes a plurality of inverters connected in series and a NAND gate or a plurality of NAND gates connected in series.

As described above, the first phase mixer 360 receives a first delayed clock signal through the first input terminal IN1 and a second delayed clock signal through the second input terminal IN2 for generating the mixed clock signal.

Herein, as shown in FIG. 5, it is assumed that the input clock signal in_clk is passed through three unit delay cells to be outputted as the first delayed clock signal. At this time, if a weight value K inputted to the first phase mixer 360 is 0, the first delayed clock signal is outputted as the mixed clock signal. That is, since the weight value K is applied to the second delayed clock signal and a weight value of (1−K) is applied to the first delayed clock signal, the second delayed clock signal is ignored when mixing phases of the first and the second delayed clock signals.

However, if it is detected by the second phase mixer 320 that a phase of the delay locked clock signal dl_clk leads a phase of the external clock signal CLK, the weight value K is gradually increased. Thereafter, if the weight value K becomes 1, the second delayed clock signal is outputted as the mixed clock signal.

However, if a phase of the delay locked clock signal dl_clk still leads a phase of the external clock signal CLK even though the weight value K becomes 1, the weight value K cannot be more increased. Therefore, at this time, the second shift register 330 shifts-left a unit delay cell of the second coarse delay line 340 so that the input clock signal in_clk can be passed through four unit delay cells, and the weight value K is changed to 0.

As a result, as shown in FIG. 5, the weight value K is changed from 1 to 0 and the first and the second delayed clock signals are delayed by the unit delay amount. However, at this time, since the weight value K is changed from 1 to 0 and the first and the second delayed clock signals are delayed by the unit delay amount at the same time, a jitter of the mixed clock signal is generated. That is, the mixed clock signal cannot be seamlessly delayed due to the jitter when a boundary switching is occurred, i.e., when a unit delay cell of the second coarse delay line 340 is shifted-left.

Figure 6:
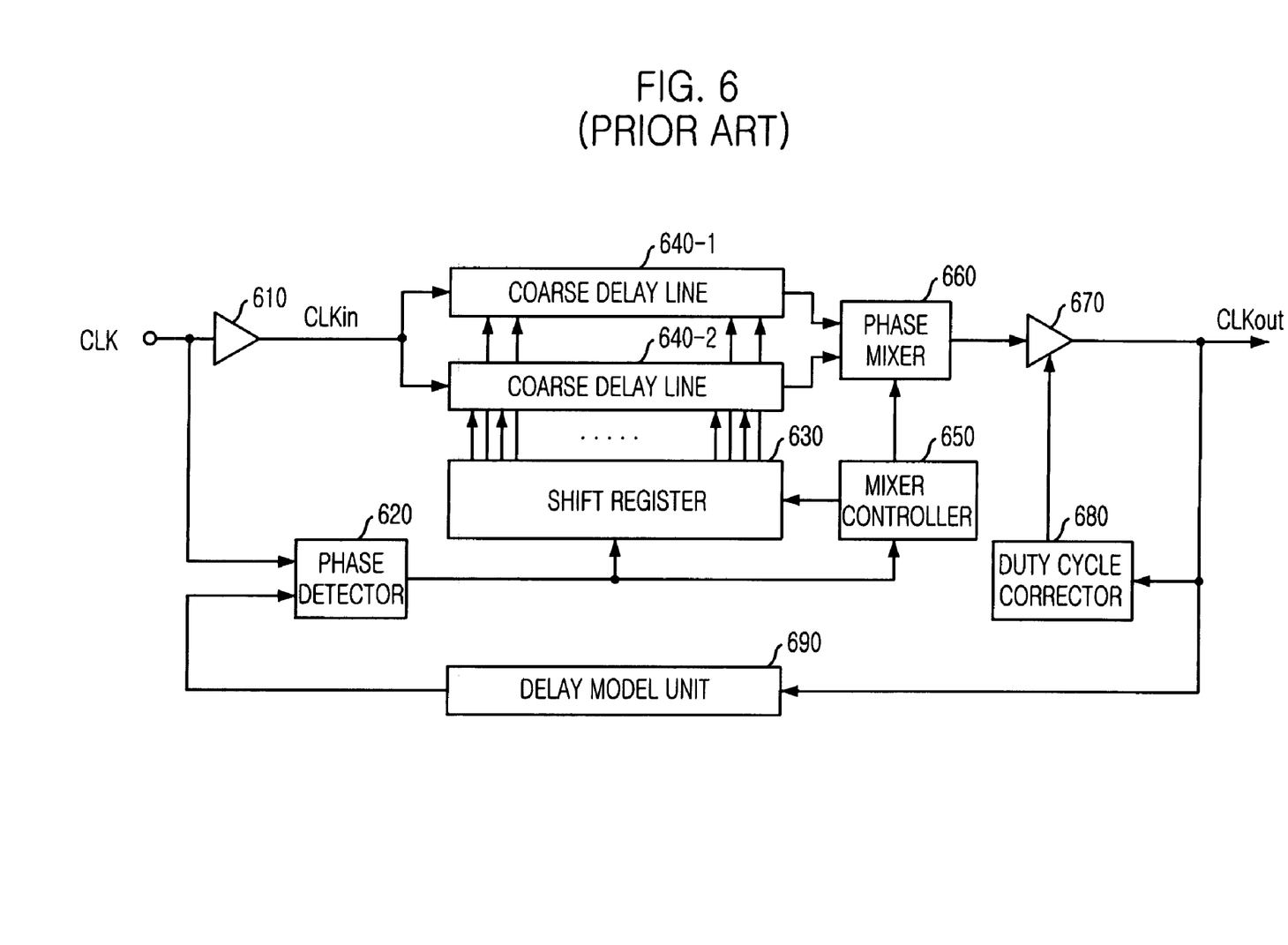
FIG. 6 is a third conventional register controlled DLL.

FIG. 6 is a third conventional register controlled DLL. The third conventional register controlled DLL is an upgraded version of the second conventional register controlled DLL shown in FIG. 3 for overcoming the above-mentioned problem of the second conventional register controlled DLL.

As shown, the third conventional register controlled DLL includes one more coarse delay line in comparison with the second conventional register controlled DLL. That is, the third conventional register controlled DLL includes a third coarse delay line 640-1 and a fourth coarse delay line 640-2.

An input clock signal in_clk is inputted to the third and the fourth coarse delay lines 640-1 and 640-2 to be delayed based on a plurality of control signals outputted from the third shift register 630. Herein, each of the third and the fourth coarse delay lines includes a plurality of unit delay cells, and one of the third and the fourth coarse delay liens includes one more unit delay cell than the other.

Thereafter, the third and the fourth coarse delay lines 640-1 and 640-2 respectively outputs a third and a fourth delayed clock signal to a second phase mixer 660. Then, the second phase mixer 660 generates a mixed clock signal by mixing phases of the third and the fourth delayed clock signals based on a control signal generated by a second mixer controller 650. Since the third and the fourth delayed clock signals are independently generated by the third and the fourth coarse delay lines 640-1 and 640-2, the boundary switching problem of the second conventional register controlled DLL can be prevented.

However, since the third conventional register controlled DLL includes two coarse delay lines, a size of the third conventional register controlled DLL is increased. Further, a circuit of the third conventional register controlled DLL is complicated because each of the two coarse delay lines receives the plurality of control signals from the third shift register 630.

SUMMARY OF INVENTION

It is, therefore, an object of the present invention to provide a register controlled DLL capable of performing a seamless boundary switching including a single coarse delay line.

In accordance with an aspect of the present invention, there is provided a register controlled DLL including a coarse delay line for generating a delayed input clock signal by delaying an external clock signal; a fine delay line unit for receiving the delayed input clock signal in order to generate a first fine delayed clock signal and a second fine delayed clock signal; a phase detector for comparing phases of the external clock signal and a feed-backed clock signal in order to generate a phase detection signal based on the comparison result; a phase mixer for generating a mixed clock signal by mixing phases of the first fine delayed clock signal and the second fine delayed clock signal based on a weight value; and a mixer controller for generating the weight value based on the phase detection signal.

In accordance with another aspect of the present invention, there is provided a register controlled DLL including: a coarse delay line for generating a delayed input clock signal in order to coarsely synchronize a delay locked clock signal with an external clock signal by delaying the external clock signal; a first fine delay line for generating a first fine delayed clock signal by delaying the delayed input clock signal; and a second fine delay line for generating a second fine delayed clock signal by delaying the delayed input clock signal, wherein the second fine delay line includes one more unit delay cell than the first fine delay line and more delays or less delays the delayed input clock signal than the first fine delay line by a delay amount of a unit delay cell.

In accordance with further another aspect of the present invention, there is provided a method for compensating a clock skew between an external clock signal and a mixed clock signal, including the steps of: generating a delayed input clock signal by delaying the external clock signal for coarsely synchronizing the delay locked clock signal with the external clock signal; generating a plurality of fine delayed clock signals having different phases by delaying the delayed input clock signal; and generating the mixed clock signal by mixing phases of the plurality of fine delayed clock signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a register controlled delay locked loop (DLL) in accordance with the present invention will be described in detail referring to the accompanying drawings.

Figure 7:
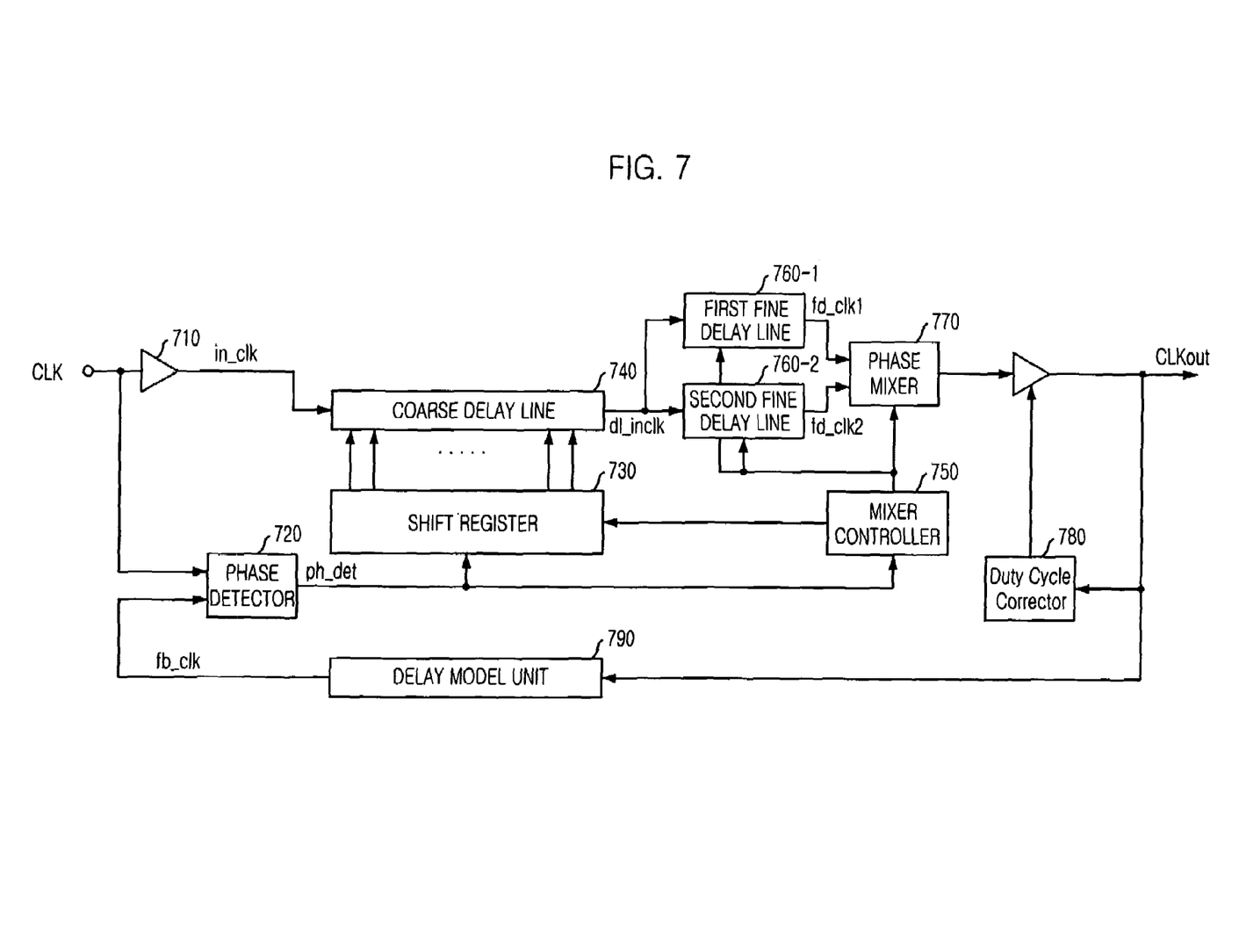
FIG. 7 is a block diagram showing a register controlled DLL in accordance with the present invention.

FIG. 7 is a block diagram showing a register controlled delay locked loop (DLL) in accordance with the present invention.

As shown, the register controlled DLL includes a buffer 710, a phase detector 720, a coarse delay line 740, a shift register 730, a first fine delay line 760-1, a second fine delay line 760-2, a phase mixer 770, a mixer controller 750, a duty cycle corrector 780 and a delay model unit 790.

The buffer 710 receives an external clock signal CLK for outputting an input clock signal in_clk by buffering the external clock signal CLK. The input clock signal in_clk is delayed by the coarse delay line 740 based on a plurality of delay control signals outputted from the shift register 730 to be outputted as a delayed input clock signal dl_inclk. Then, the delayed input clock signal dl_inclk is inputted first fine delay line 760-1 and the second fine delay line 760-2.

The first and the second fine delay lines 760-1 and 760-2 delays the delayed input clock signal dl_inclk based on a control signal outputted from the mixer controller 750 in order to respectively output a first fine delayed clock signal fd_clk1 and a second fine delayed clock signal fd_clk2.

The phase mixer 770 receives the first and the second fine delayed clock signals fd_clk1 and fd_clk2. Then, the phase mixer 360 mixes phases of the first and the second fine delayed clock signals fd_clk1 and fd_clk2 for generating a mixed clock signal having a phase between phases of the first and the second fine delayed clock signals fd_clk1 and fd_clk2. That is, a phase of the mixed clock signal leads one of phases of the first and the second fine delayed clock signals fd_clk1 and fd_clk2 and lags behind the other.

Thereafter, the mixed clock signal is passed through a buffer to be outputted as a delay locked clock signal dl_clk after being duty corrected by the duty cycle corrector 780.

The delay model unit 790 receives the delay locked clock signal dl_clk to delay the delay locked clock signal dl_clk for a predetermine delay time. Then, the delay model unit 790 outputs a feed-backed clock signal fb_clk.

The phase detector 720 receives the external clock signal CLK and the feed-backed clock signal fb_clk for comparing phases of the external clock signal CLK and the feed-backed clock signal fb_clk. The phase detector 720 generates a phase detection signal ph_det according to the comparison result.

The shift register 730 generates the plurality of delay control signals based on the phase detection signal ph_det in order to control a delay amount of the coarse delay line 740.

The mixer controller 750 generates the control signal for controlling the phase mixer 770, the first fine delay line 760-1 and the second fine delay line 760-2 based on the phase detection signal ph_det.

Each of the first and the second fine delay lines 760-1 and 760-2 includes a plurality of unit delay cells (UDCs) connected in series, and one of the first and the second fine delay lines 760-1 and 760-2 includes one more unit delay cell than the other. Herein, it is assumed that the second fine delay line 760-2 includes one more unit delay cell than the first fine delay line 760-2.

A delay amount of each of the first and the second fine delay lines 760-1 and 760-2 is controlled by changing the number of unit delay cells that the delayed input clock signal dl_inclk is passed through. Herein, the delayed input clock signal dl_inclk is passed through odd numbers of unit delay cells in the first fine delay line 760-1 and is passed through even numbers of unit delay cells in the second fine delay line 760-2. That is, for example, if the delayed input clock signal dl_inclk is passed through three unit delay cells in the first fine delay line 760-1, the delayed input clock signal dl_inclk is passed through four or two unit delay cells in the second fine delay line 760-2.

Figure 8:
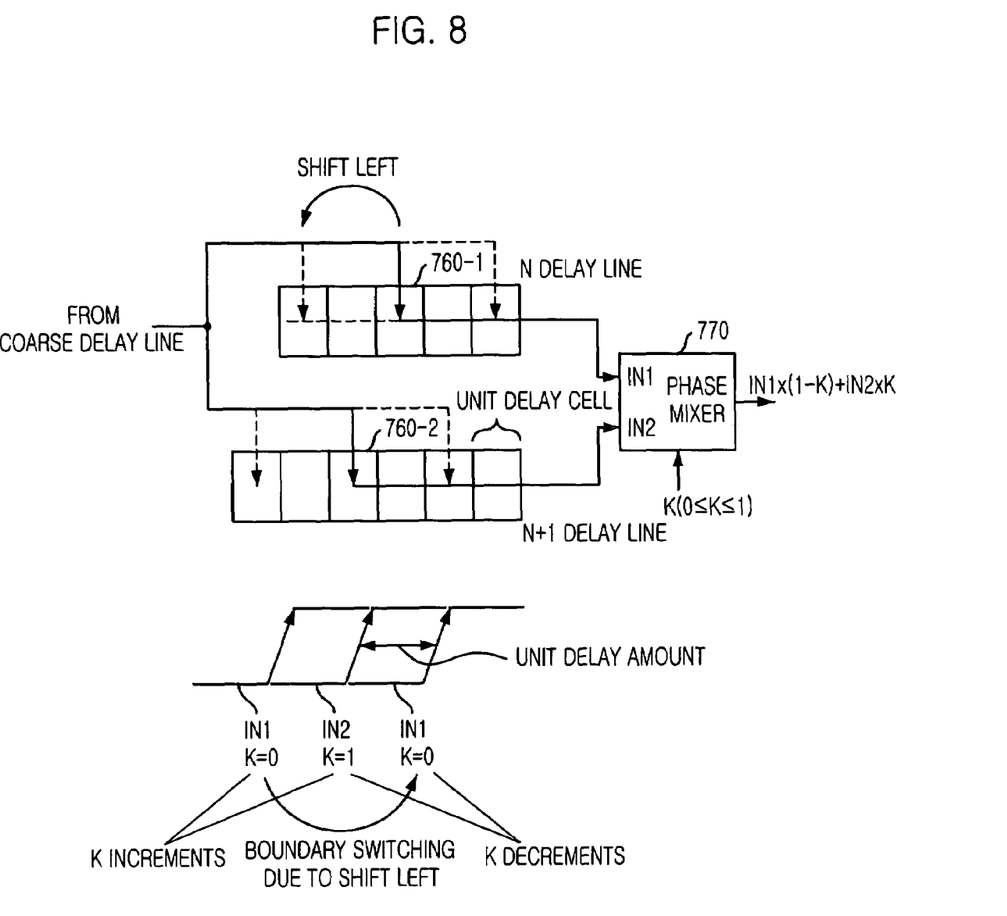
FIG. 8 is a diagram showing operations of a first fine delay line, a second fine delay line and a phase mixer shown in FIG. 7.

FIG. 8 is a diagram showing operations of the first fine delay line 760-1, the second fine delay line 760-2 and the phase mixer 770.

As shown, the first fine delayed clock signal fd_clk1 is inputted to the phase mixer 770 through a first input terminal IN1, and the second fine delayed clock signal fd_clk2 is inputted to the phase mixer 770 through a second input terminal IN2. The phase mixer 770 applies a first weight, having a value of K, to the second fine delayed clock signal fd_clk2 and applies a second weight, having a value of (1−K), to the first fine delayed clock signal fd_clk1. Herein, the value of K is greater than or equal to 0 and is smaller than or equal to 1. The value of K is determined based on the phase detection signal ph_det.

In FIG. 8, it is assumed that the delayed input clock signal dl_clk is currently passed through three unit delay cells in the first fine delay line 760-1 and four unit delay cells in the second fine delay line 760-2.

If the first weight is 0, the second fine delayed clock signal fd_clk2 is ignored, and, thus, the first fine delayed clock signal fd_clk1 is outputted as the mixed clock signal.

Thereafter, if it is detected by the phase detector 720 that a phase of the delay locked clock signal dl_clk leads a phase of the external clock signal CLK, the mixer controller 750 gradually increases the value of K. The more the value of K is increased, the more a phase of the mixed clock signal is approached to a phase of the second fine delayed clock signal. Thereafter, if the value of K becomes 1, the first fine delayed clock signal fd_clk1 is ignored, and, thus, the second fine delayed clock signal fd_clk2 is outputted as the mixed clock signal.

However, if a phase of the delay locked clock signal dl_clk still leads a phase of the external clock signal CLK, the ignored clock signal, i.e., the first fine delayed clock signal fd_clk1 in this case, is shifted-left by two unit delay cells. That is, the first fine delayed clock signal is passed through five unit delay cells in the first fine delay line 760-1. At this time, since the first fine delayed clock signal fd_clk1 is ignored due to the first weight, a delay amount variation of the first fine delayed clock signal fd_clk1 has no influence on the mixed clock signal. Therefore, a boundary switching can be seamlessly performed, i.e., a noise of the mixed clock signal is not generated during the delay amount variation.

Thereafter, if it is still required to more delay the delay locked clock signal dl_clk, the value of K is gradually decreased as shown in FIG. 8. In this case, the more the value of K is decreased, the more a phase of the mixed clock signal is approached to the first fine delayed clock signal fd_clk1.

Meanwhile, in case that a delay amount of the delay locked clock signal dl_clk is required to be decreased when a phase of the delay locked clock signal dl_clk lags behind a phase of the external clock signal CLK, the above-explained method can be reversely applied. Since it is well known to those skilled in the art, detailed description for a method of decreasing a delay amount of the delay locked clock signal dl_clk is omitted.

The mixer controller 750 controls the value of K and generates a shift left and a shift right signals for controlling a delay amount of the first and the second fine delay lines 760-1 and 760-2. Herein, a structure and an operation of the mixer controller 750 are similar to those of the second phase mixer 650 shown in FIG. 6, and the mixer controller 750 can be variously embodied. For example, the mixer controller 750 can be made including an up-down counter and a decoder. Since the mixer controller 750 can be variously made and is well known to those skilled in the art, detailed description of the mixer controller 750 is omitted.

Meanwhile, since the input clock signal in_clk is coarsely delayed by the coarse delay line 740 for synchronizing the delay locked clock signal dl_clk with the external clock signal CLK prior to delaying the delayed input clock signal dl_inclk for more finely synchronizing the delay locked clock signal dl_clk with the external clock signal CLK, a physical length of the first fine delay line 760-1 or the second fine delay line 760-2 is not required to be long. A delay line length for compensating just a delay skew generated by a noise such as a fluctuation of a power supply voltage or a jitter of the external clock signal is a sufficient physical length for the first and the second fine delayed clock signals 760-1 and 760-2.

The present application contains subject matter related to Korean patent application No. 2004-49847, filed in the Korean Patent Office on Jun. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A register controlled delay locked loop (DLL), comprising:
   a coarse delay line for generating a delayed input clock signal by delaying an external clock signal;
   a fine delay line unit for receiving the delayed input clock signal in order to generate a first fine delayed clock signal and a second fine delayed clock signal;
   a phase detector for comparing phases of the external clock signal and a feed-backed clock signal in order to generate a phase detection signal based on the comparison result;
   a phase mixer for generating a mixed clock signal by mixing phases of the first fine delayed clock signal and the second fine delayed clock signal based on a weight value; and
   a mixer controller for generating the weight value based on the phase detection signal.

2. The register controlled DLL as recited in claim 1, wherein the first fine delayed clock signal and the second fine delayed clock signal include predetermined numbers of unit delay cells for compensating a delay skew generated by a noise of the register controlled DLL.

3. The register controlled DLL as recited in claim 2, further comprising:
   a duty cycle corrector for generating a delay locked clock signal by correcting a duty cycle of the mixed clock signal; and
   a delay model unit for receiving the delay locked clock signal in order to generate the feed-backed clock signal by delaying the delay locked clock signal for a predetermined delay time.

4. The register controlled DLL as recited in claim 3, wherein the fine delay line unit includes:
   a first fine delay line, having N numbers of unit delay cells connected in series, for passing the delayed input clock signal through H numbers of unit delay cells; and
   a second fine delay line, having (N+1) numbers of unit delay cells connected in series, for passing the delayed input clock signal through (H+1) or (H−1) numbers of unit delay cells, wherein H is smaller than or equal to N.

5. The register controlled DLL as recited in claim 4, wherein the first fine delay line activates odd numbers of unit delay cells so that the delayed input clock signal can be passed through the odd numbers of unit delay cells.

6. The register controlled DLL as recited in claim 5, wherein the second fine delay line activates even numbers of unit delay cells so that the delayed input clock signal can be passed through the even numbers of unit delay cells, wherein the even numbers of unit delay cells are smaller than or greater than the odd numbers of unit delay cells by one.

7. The register controlled DLL as recited in claim 6, wherein the phase mixer applies the weight value to the first fine delayed clock signal and applies a second weight value to the second fine delayed clock signal, wherein the second weight value is obtained by subtracting the weight value from 1.

8. A register controlled DLL, comprising:
   a coarse delay line for generating a delayed input clock signal in order to coarsely synchronize a delay locked clock signal with an external clock signal by delaying the external clock signal;
   a first fine delay line for generating a first fine delayed clock signal by delaying the delayed input clock signal; and
   a second fine delay line for generating a second fine delayed clock signal by delaying the delayed input clock signal,
   wherein the second fine delay line includes one more unit delay cell than the first fine delay line and more delays or less delays the delayed input clock signal than the first fine delay line by a delay amount of a unit delay cell.

9. The register controlled DLL as recited in claim 8, wherein the first fine delayed clock signal and the second fine delayed clock signal include predetermined numbers of unit delay cells for compensating a delay skew generated by a noise of the register controlled DLL.

10. The register controlled DLL as recited in claim 9, wherein the first fine delay line, having N numbers of unit delay cells connected in series, passes the delayed input clock signal through H numbers of unit delay cells; and the second fine delay line, having (N+1) numbers of unit delay cells connected in series, passes the delayed input clock signal through (H+1) or (H−1) numbers of unit delay cells, wherein H is smaller than or equal to N.

11. The register controlled DLL as recited in claim 10, wherein the first fine delay line activates odd numbers of unit delay cells so that the delayed input clock signal can be passed through the odd numbers of unit delay cells.

12. The register controlled DLL as recited in claim 11, wherein the second fine delay line activates even numbers of unit delay cells so that the delayed input clock signal can be passed through the even numbers of unit delay cells, wherein the even numbers of unit delay cells are smaller than or greater than the odd numbers of unit delay cells by one.

13. A method for compensating a clock skew between an external clock signal and a mixed clock signal, comprising the steps of:
 a) generating a delayed input clock signal by delaying the external clock signal for coarsely synchronizing the delay locked clock signal with the external clock signal;
 b) generating a plurality of fine delayed clock signals having different phases by delaying the delayed input clock signal; and
 c) generating the mixed clock signal by mixing phases of the plurality of fine delayed clock signals.

14. The method as recited in claim 13, wherein the step of b) includes the steps of:
 d) generating a first fine delayed clock signal by delaying the delayed input clock signal; and
 e) generating a second fine delayed clock signal by delaying the delayed input clock signal,
 wherein the second fine delayed clock signal is more delayed or less delayed than the first fine delayed clock signal by a unit delay amount.

15. The method as recited in claim 14, wherein the step of c) includes the steps of:
 f) generating a phase detection signal by comparing phases of the external clock signal and the mixed clock signal;
 g) generating a weight value based on the phase detection signal; and
 h) applying the weight value to the second fine delayed clock signal and applying a value of subtracting the weight value from 1 to the first fine delayed clock signal.

* * * * *